United States Patent
Demarest et al.

(10) Patent No.: US 9,966,305 B2
(45) Date of Patent: May 8, 2018

(54) ION FLOW BARRIER STRUCTURE FOR INTERCONNECT METALLIZATION

(71) Applicant: INTERNATIONAL BUSINESS MACHINES CORPORATION, Armonk, NY (US)

(72) Inventors: James J. Demarest, Rensselaer, NY (US); James J. Kelly, Schenectady, NY (US); Koichi Motoyama, Clifton Park, NY (US); Christopher J. Penny, Saratoga Springs, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/340,153

(22) Filed: Nov. 1, 2016

(65) Prior Publication Data
US 2017/0236748 A1   Aug. 17, 2017

Related U.S. Application Data

(62) Division of application No. 15/044,258, filed on Feb. 16, 2016.

(51) Int. Cl.
*H01L 23/48* (2006.01)
*H01L 23/52* (2006.01)
*H01L 21/768* (2006.01)
*H01L 23/532* (2006.01)
(Continued)

(52) U.S. Cl.
CPC .... *H01L 21/76847* (2013.01); *H01L 21/7684* (2013.01); *H01L 21/76805* (2013.01); *H01L 21/76843* (2013.01); *H01L 21/76877* (2013.01); *H01L 23/528* (2013.01); *H01L 23/5226* (2013.01); *H01L 23/53238* (2013.01)

(58) Field of Classification Search
CPC ........... H01L 23/53238; H01L 23/5226; H01L 21/76846; H01L 21/76849; H01L 21/76877
USPC ........................................................ 257/751
See application file for complete search history.

(56) References Cited

U.S. PATENT DOCUMENTS

| | | |
|---|---|---|
| 6,140,231 A | 10/2000 | Lin et al. |
| 6,423,566 B1 | 7/2002 | Feger et al. |
| 6,562,715 B1 | 5/2003 | Chen et al. |

(Continued)

OTHER PUBLICATIONS

List of IBM Patents or Patent Applications Treated as Related dated Nov. 1, 2016, 2 pages.

(Continued)

*Primary Examiner* — Theresa T Doan
(74) *Attorney, Agent, or Firm* — Tutunjian & Bitetto, P.C.; Vazken Alexanian (57) ABSTRACT

A method for forming an ion flow barrier between conductors includes forming a barrier material through a via in an interlevel dielectric layer and onto a first metal layer and recessing the barrier material to form a thickness of the barrier material on the first metal layer in the via, the thickness forming an ion flow barrier. A second metal layer is deposited in the via over the ion flow barrier such that, during operation, the ion flow barrier reduces ion flow between the first metal layer and the second metal layer while maintaining low resistance.

9 Claims, 6 Drawing Sheets

(51) Int. Cl.
H01L 23/522 (2006.01)
H01L 23/528 (2006.01)

(56) References Cited

U.S. PATENT DOCUMENTS

| | | |
|---|---|---|
| 6,875,693 B1 | 4/2005 | May et al. |
| 7,315,084 B2 | 1/2008 | Fujii |
| 7,335,590 B2 | 2/2008 | Suh et al. |
| 7,413,984 B2 | 8/2008 | Catabay et al. |
| 8,058,646 B2 | 11/2011 | Sun et al. |
| 8,072,075 B2 | 12/2011 | Jourdan et al. |
| 8,962,466 B2 * | 2/2015 | Lee .................. H01L 45/141 257/4 |
| 2010/0252928 A1 * | 10/2010 | Ohtsuka ............ H01L 21/28556 257/751 |
| 2014/0001429 A1 | 1/2014 | He et al. |
| 2014/0131653 A1 * | 5/2014 | Lee .................. G11C 11/00 257/4 |
| 2015/0187941 A1 | 7/2015 | Zhou |
| 2016/0300730 A1 * | 10/2016 | Wu .................. H01L 21/02074 |

OTHER PUBLICATIONS

Raval, M.C. et al., "Review of Ni-Cu Based Front Side Metallization for c-Si Solar Cells" J. Solar Energy (2013) pp. 1-20, vol. 2013.
Wu, W.F. et al., "Effects of Nitrogen Plasma Treatment on Tantalum Diffusion Barriers in Copper Metallization" Journal of the Electrochemical Society (2003) pp. G83-G89, vol. 150, No. 2.
McPherson, J.W., "Reliability Physics and Engineering: Time-to-Failure Modeling" 2nd Edition, Springer 2013, pp. 1-405.

* cited by examiner

FIG. 9

ION FLOW BARRIER STRUCTURE FOR INTERCONNECT METALLIZATION

BACKGROUND

Technical Field

The present invention relates to semiconductor processing, and more particularly to an ion flow barrier and methods for fabrication to reduce electromigration of ions while maintaining low resistance interconnect interfaces.

Description of the Related Art

Reliability and electromigration performance are negatively impacted as barrier thickness is downscaled in back end of the line (BEOL) Cu interconnects. In addition to risks associated with barrier continuity on sidewalls, discontinuities in the barrier (such as TaN) at a via bottom lead to breakdown of "short-length" criterion. This criterion requires blocking of Cu ion flow at a via bottom to prevent massive Cu ion migration from level to level.

SUMMARY

A method for forming an ion flow barrier between conductors includes forming a barrier material through a via in an interlevel dielectric layer and onto a first metal layer and recessing the barrier material to form a thickness of the barrier material on the first metal layer in the via, the thickness forming an ion flow barrier. A second metal layer is deposited in the via over the ion flow barrier such that, during operation, the ion flow barrier reduces ion flow between the first metal layer and the second metal layer while maintaining low resistance. In other embodiments, the ion flow barrier is formed by reacting the barrier material with the first metal layer.

Another method for forming an ion flow barrier between conductors includes forming a barrier material through a via in an interlevel dielectric layer and onto a first metal layer; annealing the barrier material to react with the barrier material with the first metal layer to form an ion flow barrier; recessing the barrier material to expose the ion flow barrier in the via; and depositing a second metal layer in the via over the ion flow barrier such that, during operation, the ion flow barrier reduces ion flow between the first metal layer and the second metal layer while maintaining low resistance.

A device having an ion flow barrier between conductors includes a first metal layer, an interlevel dielectric layer formed on the first metal layer and having a via formed through the interlevel dielectric layer and an ion flow barrier. The ion flow barrier is formed in the via and has a thickness of barrier material. The ion flow barrier includes a material different from the first metal layer and the second metal layer. A second metal layer is formed on the ion flow barrier in the via such that, during operation, the ion flow barrier reduces ion flow between the first metal layer and the second metal layer while maintaining low resistance.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, devices and methods for fabrication of such devices are provided that include an ion flow barrier structure to prevent metal ion flow through an interconnect via bottom. The ion flow barrier structure enables highly reliable metallization at low via resistance. As interconnect feature sizes shrink, barrier thickness needs to be scaled to maximize metal volume and to enable low line and via resistance. Scaling sidewall barrier thickness permits the maximization of metal volume in interconnects, and scaling barrier thickness at via bottom allows reduction of via resistance. To meet reliability targets, the presence of an ion flow barrier is employed to prevent interconnect metal ion flow through a via bottom. Such an ion flow barrier needs low resistivity materials, compatible with metallization process flows.

In particularly useful embodiments, the metallizations may include Cu although other highly conductive materials and in particular metals may be employed. Some embodiments may include an inert ion barrier disposed between metallizations on different metal layers. The inert ion barrier may include, e.g., W. Some embodiments may include an active or dynamic ion barrier disposed between metallizations on different metal layers. The active ion barrier may include, e.g., CuPt. Other materials may also be employed for the inert and/or the active ion barriers.

The present principles may be employed in any semiconductor device or integrated circuit. The ion barriers as described herein may be formed between any two conductors to prevent electromigration due to ion flow. The present principles may also be employed in vertical as well and horizontal interconnects, and may be employed in contacts at tops of vias as well as or in addition to the bottoms of vias.

It is to be understood that the present invention will be described in terms of a given illustrative architecture or architectures; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., CuPt. These compounds include different proportions of the elements within the compound, e.g., CuPt includes $Cu_xPt_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
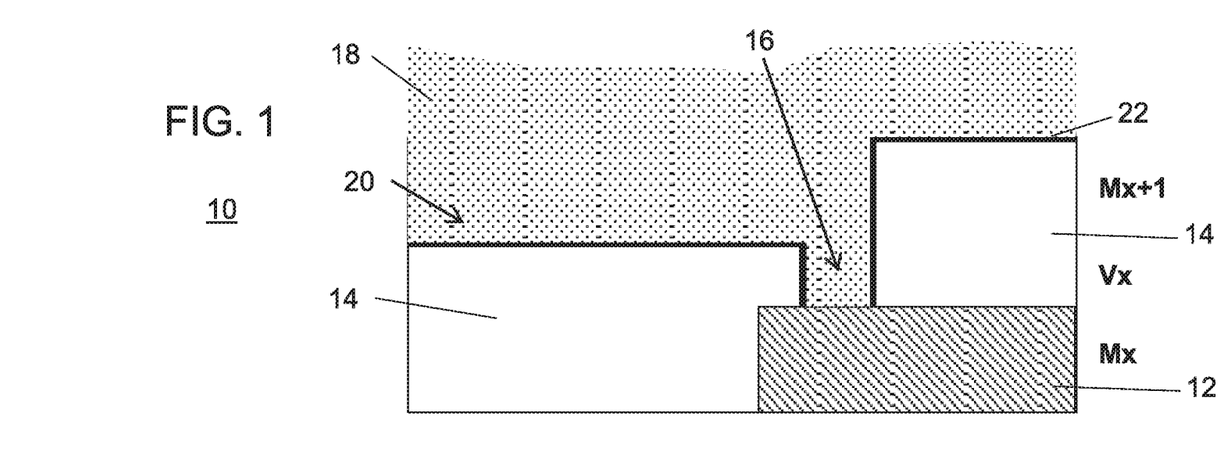
FIG. 1 is a cross-sectional view of a semiconductor device having a barrier material formed in a via in contact with a first metal layer, and the barrier material also being formed in a trench in accordance with the present principles.

Referring now to the drawings in which like numerals represent the same or similar elements and initially to FIG. 1, a partially fabricated semiconductor device 10 is depicted showing a first metal layer 12 (Mx) and an interlevel dielectric layer (ILD) or layers 14, which are processed to form a via 16 at a via level (Vx). The first metal layer 12 is described as being first in the relative sense for ease of reference. The first metal layer 12 may be any metal layer in a plurality of metal layers or metal structures as the case may be. In addition, the ILD 14 may include any number of configurations including, e.g., a level top surface on both sides of the via 16, multiple dielectric layers, dual damascene structures where a via and metal line are formed together, etc.

A liner 22 may be formed over surfaces of the ILD 14. The liner 22 may include materials such as, e.g., Ta, TaN, TiN or other suitable materials. The liner 22 may be removed from a surface of the first metal layer 12 within the via 16 or may remain on the metal layer 12. After the liner deposition, which may include a sputtering process, an etch process may be performed (e.g., a reactive ion etch (RIE)), to remove the liner 22 from the bottom of the via 16.

Electromigration of material is more pronounced in regions of reduced area. Such areas may include regions where a contact through a via connects to a metal line or metal node. In accordance with the present principles, an ion flow barrier structure is formed to prevent metal ion flow through an interconnect via bottom, enabling highly reliable metallization at a low via resistance.

A barrier material 18 is formed in the via 16 and in a trench 20 (if present, e.g., if a metal line is to be formed with a via contact). The barrier material 18 includes an inert material in one embodiment. The inert material includes an inert metal having good conductive properties. In one embodiment, the inert material includes W. In other embodiments, the inert material may include Mo, MoTa, MoRu, RuTa, RuW, TaW, TiW, alloys of these and other materials and similar alloys including alternative W-based alloys. The barrier material 18 may be sputtered, deposited by evaporation methods, deposited by chemical vapor deposition methods or any other suitable deposited method.

Barrier material 18 may be formed by physical vapor deposition (PVD), chemical vapor deposition (CVD), and/or atomic layer deposition (ALD) including any thermal or plasma (e.g., Ar, $H_2$, He) pre-treatment processes prior to barrier deposition. Process temperatures for barrier deposition can range from about 20° C. to about 350° C., while typical pre-treatment process temperatures can range from about 80° C. to about 400° C.

Figure 2:
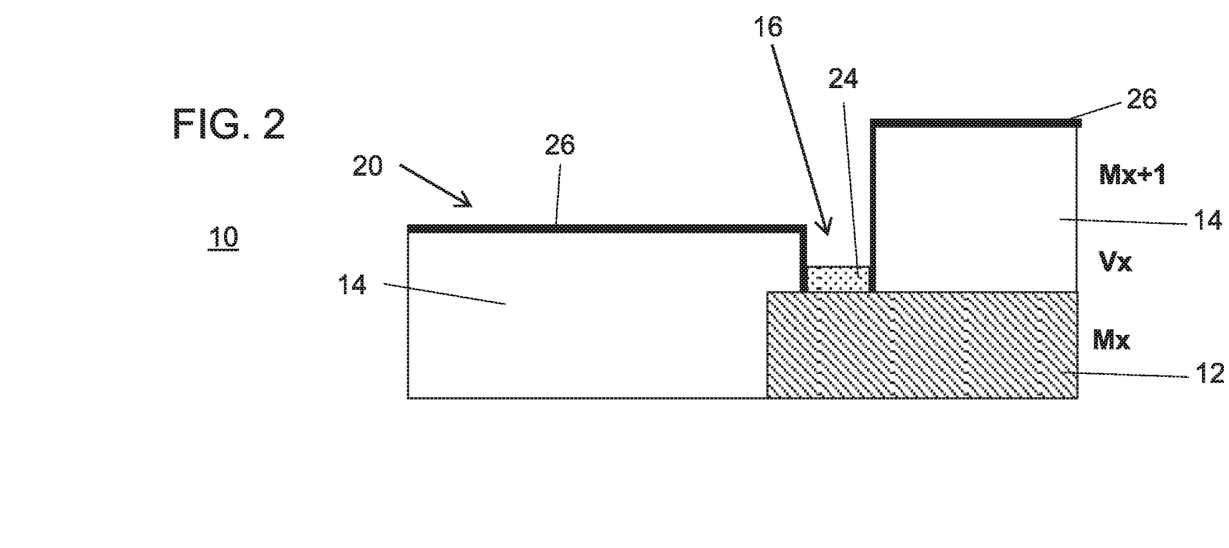
FIG. 2 is a cross-sectional view of the semiconductor device of FIG. 1 having the barrier material recessed to form an inert ion barrier in accordance with the present principles.

Referring to FIG. 2, a planarization process is performed to planarize the barrier material 18. The planarization process may include a chemical mechanical polishing (CMP) process. The barrier material 18 is then recessed to remove the barrier material 18 from the trench 20 and down into a bottom of the via 16 to form an ion flow barrier 24. The recess process may include a RIE selective to the liner 22 and/or the ILD 14. The ion flow barrier 24 may include a thickness of between 1 nm and 10 nm, although other thicknesses may be employed.

An additional liner 26 may optionally be formed on the exposed surfaces including the barrier 24. The liner 26 may include the liner 24 or may be employed instead of liner 24. Liner 26 may include the same materials as liner 24.

Figure 3:
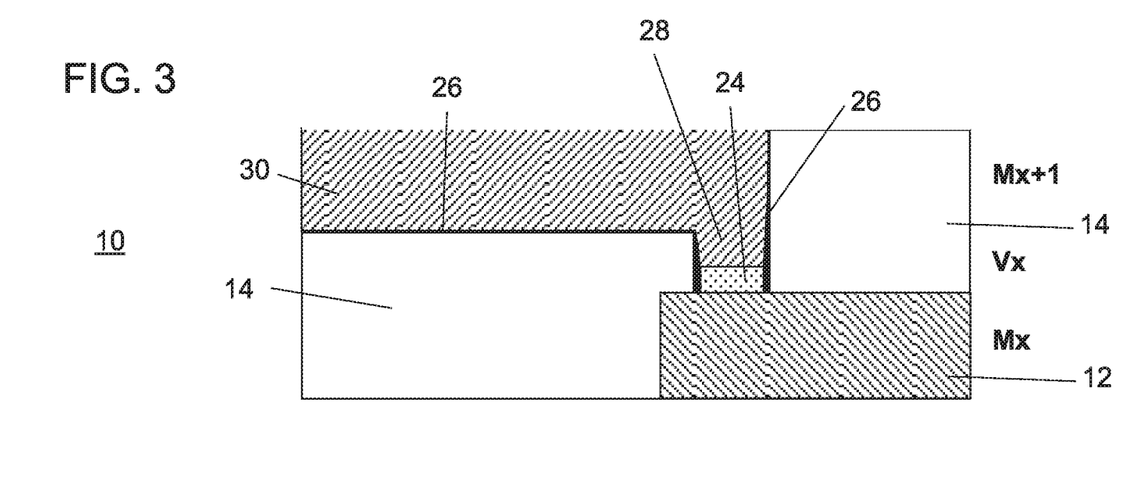
FIG. 3 is a cross-sectional view of the semiconductor device of FIG. 2 having the ion barrier covered with a second metal layer to form a contact and metal line in accordance with the present principles.

Referring to FIG. 3, a metal deposition process is performed to form metallizations including, e.g., metal lines 30 (Mx+1) and contacts 28 (Vx). The contacts 28 include the ion barrier 24. The metal lines 30 and contacts 28 may include Cu and/or its alloys. Other metals may also be employed. A planarization process may be employed to planarize the deposited material (e.g., CMP) to form metal lines 30 and/or contacts 28.

Processing may continue with the formation of additional metal layers and contacts (along with ILD layers). The additional contacts may include ion flow barriers 24 formed in a same way or may include variations on the size and composition of the ion flow barrier 24 in accordance with the design of the device 10.

Figure 4:
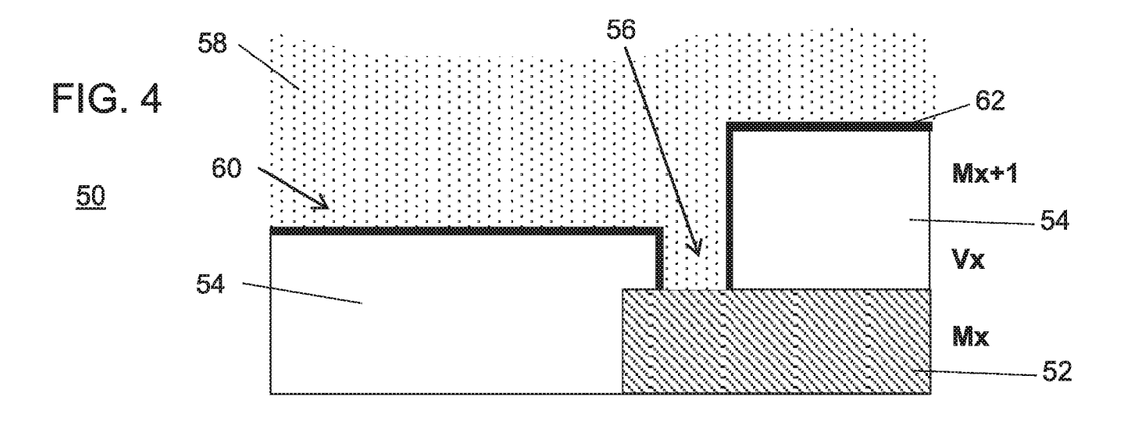
FIG. 4 is a cross-sectional view of a semiconductor device having a barrier material formed in a via in contact with a first metal layer, and the barrier material also being formed a trench in accordance with the present principles.

Referring to FIG. 4, another partially fabricated semiconductor device 50 is depicted showing a first metal layer 52 (Mx) and an interlevel dielectric layer (ILD) or layers 54, which are processed to form a via 56 at a via level (Vx). The first metal layer 52 is described as being first in the relative sense. The first metal layer 52 may be any metal layer or metal structures as the case may be. In addition, the ILD 54 may include any number of configurations including, e.g., a level top surface on both sides of the via 56, multiple dielectric layers, dual damascene structures where a via and metal line are formed together, etc.

A liner 62 may be formed over surfaces of the ILD 54. The liner 62 may include materials such as, e.g., Ta, TaN, TiN or other suitable materials. The liner 62 may be removed from a surface of the first metal layer 52 within the via 56 or may remain on the metal layer 52. After the liner deposition, which may include a sputtering process, an etch process may be performed (e.g., a reactive ion etch (RIE)), to remove the liner 52 from the bottom of the via 56.

In accordance with the present principles, an ion flow barrier structure is formed to prevent metal ion flow through an interconnect via bottom, enabling highly reliable metallization at a low via resistance. A barrier material 58 is formed in the via 56 and in a trench 60 (if present, e.g., if a metal line is to be formed with a via contact). The barrier material 58 includes a dynamic material in one embodiment. The barrier material 58 may be deposited by a sputter-etch or other deposition process to deposit ion flow starting material or barrier material 58. The barrier material 58 may include, e.g., Pt, Pt—W or other suitable materials. The dynamic material may include a metal having good conductive properties. In one embodiment, the dynamic material includes Pt. In other embodiments, the dynamic material may include Pt, Pd, Ni, or alloys of these and other materials and similar alloys including alternative Pt-based alloys. The barrier material 58 may be sputtered, deposited by evaporation methods, deposited by chemical vapor deposition methods or any other suitable deposition method.

Figure 5:
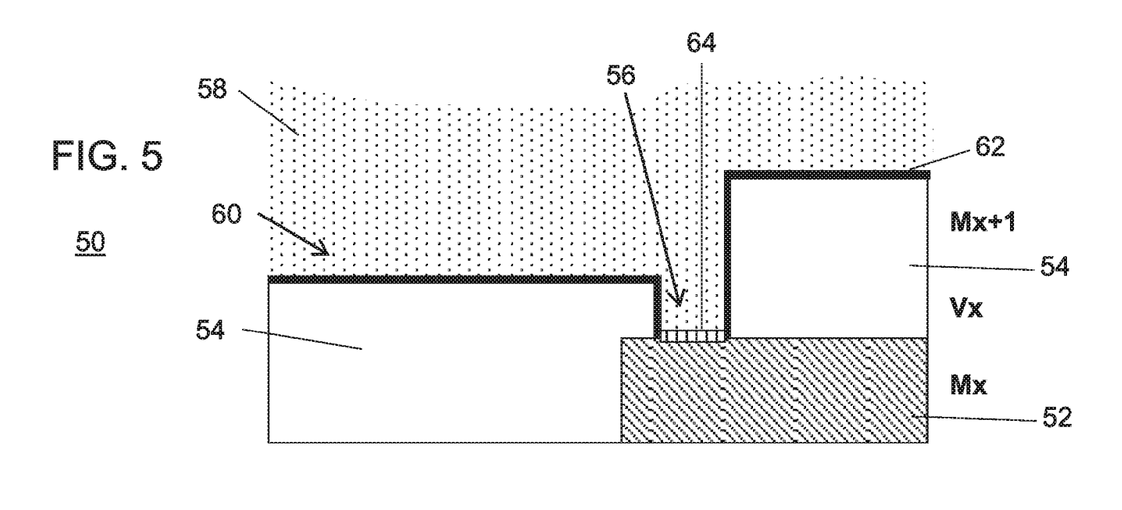
FIG. 5 is a cross-sectional view of the semiconductor device of FIG. 4 having the barrier material reacted with the first metal layer to form an ion barrier in accordance with the present principles.

Referring to FIG. 5, with the barrier material 58 in contact with the first metal layer 52, an anneal process is performed to form ion flow barrier 64 by reacting the barrier material 58 with the first metal layer 52. In one example, the barrier material 58 may include Pt and the first metal layer 52 may include Cu such that the ion flow barrier 64 includes CuPt.

Barrier material 58 may be formed by PVD, CVD and/or ALD including any thermal or plasma (e.g., Ar, $H_2$, He) pre-treatment processes prior to barrier deposition. Process temperatures for barrier deposition can range from about 20° C. to about 350° C., while typical pre-treatment process temperatures can range from about 80° C. to about 400° C.

Figure 6:
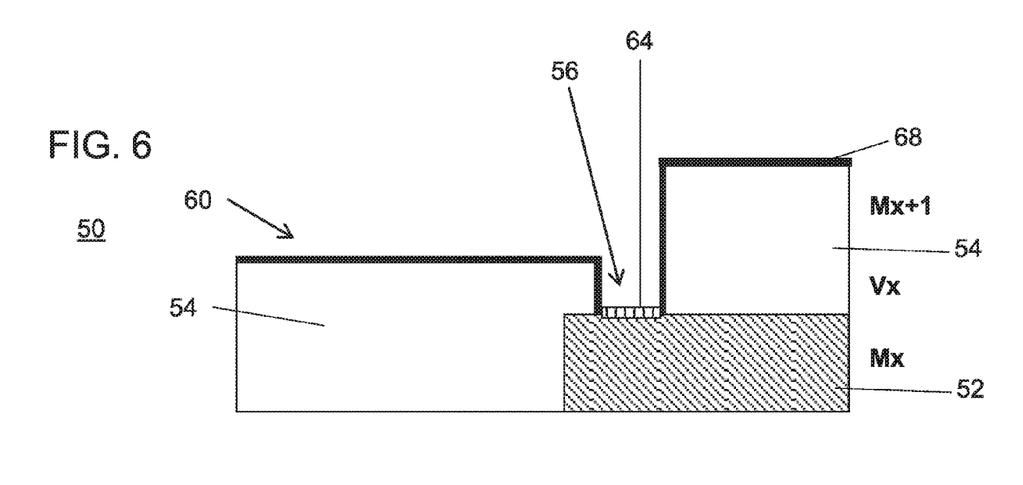
FIG. 6 is a cross-sectional view of the semiconductor device of FIG. 5 having the barrier material recessed to expose the ion barrier in accordance with the present principles.

Referring to FIG. 6, the barrier material 58 is removed. This may include a planarization process to planarize the barrier material 58. The planarization process may include a chemical mechanical polishing (CMP) process. The barrier material 58 is then recessed to remove the barrier material 58 from a trench 60 and down into a bottom of a via 56 to form an ion flow barrier 64. The recess process may include a RIE selective to the liner 62 and/or the ILD 54. The ion flow barrier 64 may include a thickness of between 0.5 nm and 8 nm, although other thicknesses may be employed.

An additional liner 68 may optionally be formed on the exposed surfaces including the barrier 64. The liner 68 may include the liner 62 or may be employed instead of liner 62. Liner 68 may include the same materials as liner 62.

Figure 7:
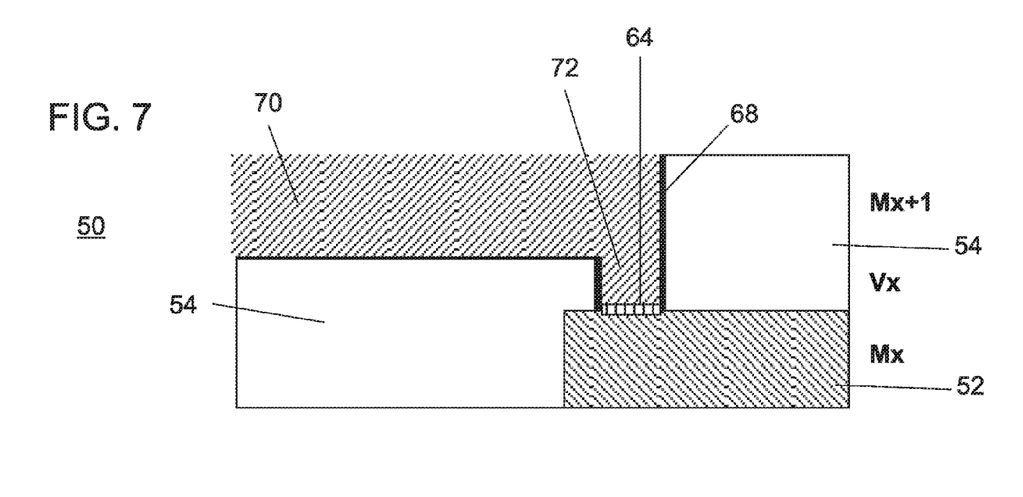
FIG. 7 is a cross-sectional view of the semiconductor device of FIG. 6 having the ion barrier covered with a second metal layer to form a contact and metal line in accordance with the present principles.

Referring to FIG. 7, a metal deposition process is performed to form metallizations including, e.g., metal lines 70 (Mx+1) and contacts 72 (Vx). The contacts 72 include the ion barrier 64. The metal lines 70 and contacts 72 may include Cu and/or its alloys. Other metals may also be employed. A planarization process may be employed to planarize the deposited material (e.g., CMP) to form metal lines 70 and/or contacts 72.

Processing may continue with the formation of additional metal layers and contacts. The additional contacts may include ion flow barriers 64 formed in a same way or may include variations on the size and composition of the ion flow barrier 64 in accordance with the design of the device 50.

In accordance with the present principles, structures 24 and 64 provide an ion flow barrier, which can prevent the flow of interconnect metal ions to ensure integrity in electromigration performance. In one embodiment, the structures provide both ion flow barrier functionality as well as Cu surface diffusion mitigation. Structures 24 and 64 are placed at the bottom of a via; however, the structures 24 and 64 may also be placed at the tops of interconnects (or both). In some embodiments, the structures 24 and 64 are formed on the top and bottom of a via to act in unison as an ion flow barrier.

The structures (e.g., 24 and 64) may include an ion flow barrier structure formed with inert materials (e.g., W) or by reaction of a starting material (e.g., Pt, Pt—W) combined with a prior level material such as Cu to form, e.g. CuPt or CuPt—W. The structures (e.g., 24 and 64) may include low resistivity ion flow barrier materials such as Mo, MoTa, MoRu, RuTa, RuW, TaW, TiW and similar alloys including alternative W-based alloys for inert embodiments, and Pt, Pd, Ni, or alloys of these and other materials and similar alloys including alternative Pt-based alloys for dynamic material embodiments. The structures (e.g., 24 and 64) resist ion migration while permitting electron flow. This reduces electromigration while maintaining low resistivity at interconnects.

Figure 8:
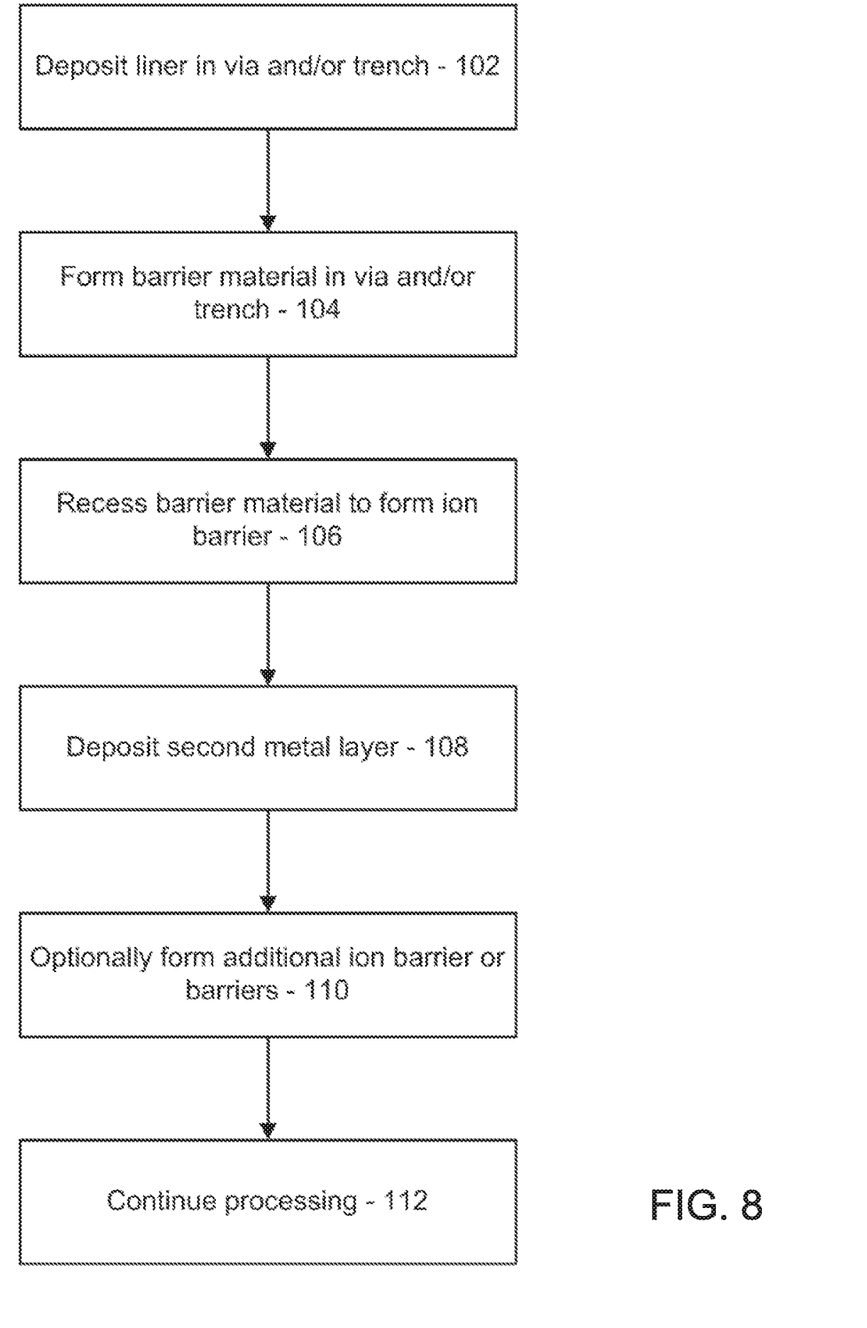
FIG. 8 is a block/flow diagram showing a method for forming an inert ion flow barrier between conductors in accordance with one illustrative embodiment.
Figure 9:
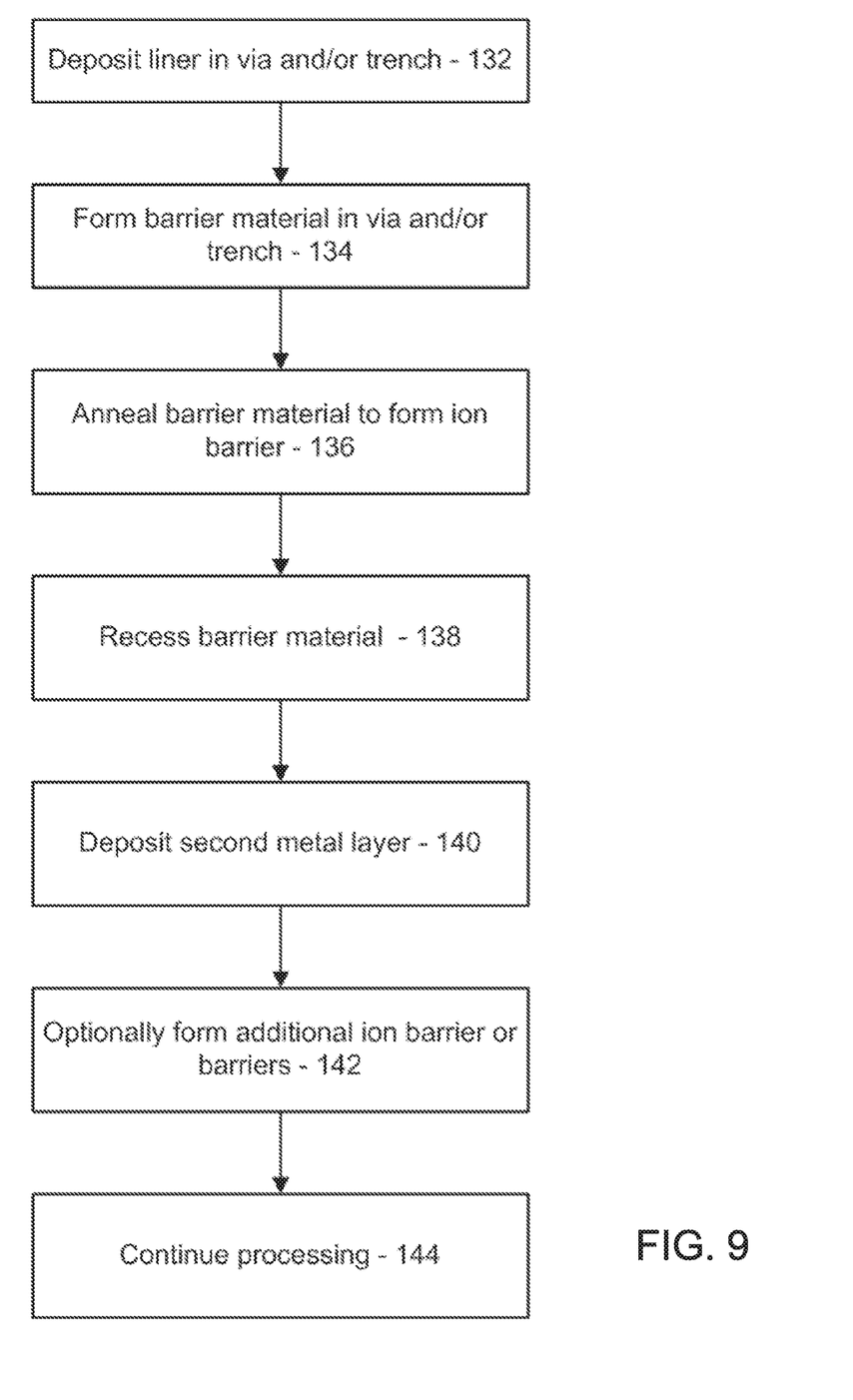
FIG. 9 is a block/flow diagram showing a method for forming a dynamic/reacted ion flow barrier between conductors in accordance with another illustrative embodiment.

In some alternative implementations as illustrated in FIGS. 8 and 9, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring to FIG. 8, a method for forming an ion flow barrier between conductors is illustratively shown in accordance with one embodiment. In block 102, a liner may be formed on sidewalls (and/or the bottom) of a via through an interlevel dielectric layer. In block 104, a barrier material is formed through a via in an interlevel dielectric layer and onto a first metal layer. The barrier material includes an inert metal. The inert metal may include one or more of W, Mo, Ta, Ru or TiW.

In block 106, the barrier material is recessed to form a thickness of the barrier material on the first metal layer in the via, the thickness forming an ion flow barrier. The recessing may include a CMP process followed by a selective etch. The ion flow barrier may include a thickness of between about 1 nm and about 10 nm.

In block 108, a second metal layer is deposited in the via over the ion flow barrier such that, during operation, the ion flow barrier reduces ion flow between the first metal layer and the second metal layer while maintaining low resistance. The low resistance includes a resistivity capable of meeting contact resistance specifications for a given device node or technology. In one embodiment, the second metal layer forms a contact in the via and a metal line in a trench formed in the interlevel dielectric layer. A first or additional liner may be formed and processed before forming the second metal layer.

In block 110, an additional ion flow barrier is formed above or in the via. In this way, multiple ion flow barriers may be employed at a same interconnect or via. In block 112, processing continues to complete the device.

Referring to FIG. 9, a method for forming an ion flow barrier between conductors is illustratively shown in accordance with another embodiment. In block 132, a liner may be formed on sidewalls (and/or the bottom) of a via through an interlevel dielectric layer. In block 134, a barrier material is formed through a via in an interlevel dielectric layer and onto a first metal layer. In block 136, the barrier material is annealed to react with the barrier material with the first metal layer to form an ion flow barrier. The anneal process may include a rapid thermal anneal (RTA) or may include other anneal processes depending on the materials. The anneal temperatures and times will depend upon the materials and the size of the ion barrier needed for a particular application. The barrier material may include one or more of Pt or Pt—W, Pd, Ni, or alloys of these and other materials and similar alloys including alternative Pt-based alloys. The ion flow barrier may include one or more of CuPt or CuPt—W after the anneal. The ion flow barrier may include a thickness of between about 0.5 nm and about 8 nm.

In block 138, the barrier material is recessed to expose the ion flow barrier in the via. The recess process may include CMP followed by a selective etch. In block 140, a second metal layer is deposited in the via over the ion flow barrier such that, during operation, the ion flow barrier reduces ion flow between the first metal layer and the second metal layer while maintaining low resistance. In one embodiment, the second metal layer forms a contact in the via and a metal line in a trench formed in the interlevel dielectric layer. A first or additional liner may be formed and processed before forming the second metal layer.

In block 142, an additional ion flow barrier is formed above or in the via. In this way, multiple ion flow barriers may be employed at a same interconnect or via. In block 144, processing continues to complete the device.

Having described preferred embodiments for ion flow barrier structure for interconnect metallization (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A device having an ion flow barrier between conductors, comprising:
    a first metal layer;
    an interlevel dielectric layer formed on the first metal layer and having a via formed through the interlevel dielectric layer;
    an ion flow barrier formed in the via and having a thickness of barrier material, the ion flow barrier including a material different from the first metal layer; and
    a second metal layer formed on the ion flow barrier in the via such that the ion flow barrier is interposed between the first and second metal layers and, during operation, the ion flow barrier reduces ion flow between the first metal layer and the second metal layer while maintaining low resistance.

2. The device as recited in claim 1, wherein the ion flow barrier includes one or more of W, Mo, Ta, Ru or TiW or alloys thereof.

3. The device as recited in claim 1, wherein the ion flow barrier includes one or more of Pt, Pd, Ni, or alloys of thereof reacted with the first metal layer.

4. The device as recited in claim 1, further comprising a liner formed on sidewalls of the via.

5. The device as recited in claim 1, wherein the ion flow barrier includes a thickness of between 0.5 nm and 10 nm.

6. The device as recited in claim 1, further comprising an additional ion flow barrier formed above or in the via.

7. The device as recited in claim 1, wherein the second metal layer forms a contact in the via.

8. The device as recited in claim 1, wherein the second metal layer forms a metal line in a trench formed in the interlevel dielectric layer.

9. The device as recited in claim 1, wherein the ion flow barrier includes one or more of CuPt or CuPtW.

* * * * *